(12) United States Patent  
Kim

(10) Patent No.: US 8,379,463 B2  
(45) Date of Patent: Feb. 19, 2013

(54) BIT LINE PRECHARGE VOLTAGE GENERATION CIRCUIT FOR SEMICONDUCTOR MEMORY APPARATUS

(75) Inventor: Jong Hwan Kim, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 254 days.

(21) Appl. No.: 12/839,252

(22) Filed: Jul. 19, 2010

(65) Prior Publication Data

US 2011/0170363 A1    Jul. 14, 2011

(30) Foreign Application Priority Data

Jan. 8, 2010    (KR) .................. 10-2010-0001773

(51) Int. Cl.
*G11C 5/14* (2006.01)
*G11C 7/00* (2006.01)

(52) U.S. Cl. ............... 365/189.09; 365/222; 365/226

(58) Field of Classification Search .............. 365/189.09
See application file for complete search history.

(56) References Cited

U.S. PATENT DOCUMENTS

| 5,808,953 | A | * | 9/1998 | Kim et al. ............... 365/226 |
| 5,828,614 | A |   | 10/1998 | Gradinariu |
| 6,026,035 | A |   | 2/2000 | Kim |
| 6,141,275 | A |   | 10/2000 | Tsai et al. |
| 6,275,429 | B1 |  | 8/2001 | Bae et al. |
| 6,552,942 | B2 |  | 4/2003 | Kim et al. |
| 6,570,916 | B1 |  | 5/2003 | Feldbaumer et al. |
| 7,391,254 | B2 | * | 6/2008 | Lim et al. ............... 327/538 |
| 7,450,439 | B2 | * | 11/2008 | Lee et al. ............... 365/189.09 |
| 7,881,128 | B2 | * | 2/2011 | Kim ..................... 365/189.07 |
| 2004/0251957 | A1 | * | 12/2004 | Do ....................... 327/541 |

FOREIGN PATENT DOCUMENTS

| JP | 11-007770 | 1/1999 |
| JP | 2005-276348 | 10/2005 |
| KR | 1019990061030 A | 7/1999 |
| KR | 1020040105976 A | 12/2004 |

* cited by examiner

*Primary Examiner* — Son Mai

(74) *Attorney, Agent, or Firm* — William Park & Associates Ltd.

(57) ABSTRACT

Various embodiments of a bit line precharge voltage generation circuit for a semiconductor memory apparatus are disclosed. In one exemplary embodiment, a bit line precharge voltage generation circuit may include a voltage division block for dividing an internal voltage to generate a first division voltage and a second division voltage, wherein a level of the second division voltage is higher than a level of the first division voltage; a pull-up amplification block for comparing the level of the first division voltage with a level of a bit line precharge voltage on a bit line precharge voltage line, to raise the level of the bit line precharge voltage; and a pull-down amplification block for comparing the level of the second division voltage with the level of the bit line precharge voltage to lower the level of the bit line precharge voltage.

17 Claims, 3 Drawing Sheets

BIT LINE PRECHARGE VOLTAGE GENERATION CIRCUIT FOR SEMICONDUCTOR MEMORY APPARATUS

CROSS-REFERENCE TO RELATED APPLICATION

The present application claims priority under 35 U.S.C. §119(a) to Korean Application No. 10-2010-0001773, filed on Jan. 8, 2010, in the Korean Intellectual Property Office, which is incorporated herein by reference in its entirety as set forth in full.

BACKGROUND

1. Technical Field

Various embodiments of the present disclosure generally relate to semiconductor integrated circuits, and more particularly, to bit line precharge voltage generation circuits for semiconductor memory apparatuses.

2. Related Art

A semiconductor memory apparatus may transfer data stored in a memory cell to a bit line, amplify the data transferred to the bit line through a bit line sense amplifier, sequentially transfer the amplified data to a sub input/output line and a local input/output line, and output the data to the outside of the semiconductor memory apparatus.

FIG. 1 is a diagram illustrating a conventional semiconductor memory apparatus. A conventional semiconductor memory apparatus may include a first switching unit 10, a first precharge unit 20, a second switching unit 30, and a second precharge unit 40.

The first switching unit 10 may include first and second transistors N1 and N2. The first switching unit 10 may connect bit lines BL and BLb to sub input/output lines SIO and SIOb in response to a column select signal Yi.

The first precharge unit 20 may include third through fifth transistors N3 through N5. The first precharge unit 20 may precharge the sub input/output lines SIO and SIOb to a level of a bit line precharge voltage VBLP when a bit line equalization signal BLEQ is lowered to a low level.

The second switching unit 30 may include sixth and seventh transistors N6 and N7. The second switching unit 30 may connect the sub input/output lines SIO and SIOb to the local input/output lines LIO and LIOb when the bit line equalization signal BLEQ is raised is to a high level.

Second precharge unit 40 may include eighth through tenth transistors P1 through P3. Second precharge unit 40 may precharge the local input/output lines LIO and LIOb to a level of a core voltage Vcore. The level of the bit line precharge voltage VBLP may be half the level of the core voltage Vcore.

The semiconductor memory apparatus, illustrated in FIG. 1, may raise the bit line precharge voltage VBLP through repetitive refresh operations. A precharge operation may follow each refresh operation. Hence, the precharge operation may repeat along with the refresh operation.

As illustrated in FIG. 1, second precharge unit 40 may precharge the local input/output lines LIO and LIOb to the level of the core voltage Vcore, and the first precharge unit 20 may precharge the sub input/output lines SIO and SIOb to the level of the bit line precharge voltage VBLP. Meanwhile, when the precharge operation is not performed, the second switching unit 30 may connect the sub input/output lines SIO and SIOb to the local input/output lines LIO and LIOb, respectively. That is, when the bit line equalization signal BLEQ increases to a high level, the second switching unit 30 may connect the sub input/output lines SIO and SIOb to the local input/output lines LIO and LIOb, respectively. When the bit line equalization signal BLEQ is lowered to a low level, the first precharge unit 20 may precharge the sub input/output lines SIO and SIOb.

As the refresh operation is repeated, the number of connections between the local input/output lines LIO and LIOb precharged to the level of the core voltage Vcore and the sub input/output lines SIO and SIOb precharged to the level of the bit line precharge voltage VBLP may increase. Therefore, the voltage levels of the precharged sub input/output lines SIO and SIOb may become higher than the level of the bit line precharge voltage VBLP, which may raise the level of the bit line precharge voltage VBLP. Specifically, the semiconductor memory apparatus may supply the bit line precharge voltage VBLP to the sub input/output lines SIO and SIOb when the sub input/output lines SIO and SIOb are precharged. However, the voltage levels of the sub input/output lines SIO and SIOb may be raised due to the repetitive refresh operations, and the voltages of the sub input/output lines SIO and SIOb may flow to a node where the bit line precharge voltage VBLP is applied. Thus, the level of the bit line precharge voltage VBLP may be raised.

When the bit line precharge voltage VBLP is raised, the precharge voltage level of the bit lines BL and BLb may be also raised. Therefore, when data of the memory cell is transferred to the bit lines BL and BLb, a voltage difference between the bit lines BL and BLb is less than a preset voltage difference. Hence, a bit line sense amplifier configured to sense and amplify the voltage levels of the bit lines BL and BLb may operate abnormally.

SUMMARY

Accordingly, there is a need for an improved bit line sense is amplifier that may overcome one or more of the problems discussed above. Therefore, various aspects of the present invention may provide bit line precharge voltage generation circuits for semiconductor memory apparatuses that may prevent bit line precharge voltage from being raised, even during repetitive refresh operations.

To attain the advantages and in accordance with the purposes of the invention, as embodied and broadly described herein, one exemplary aspect of the invention may provide a bit line precharge voltage generation circuit for a semiconductor comprising: a voltage division block configured to divide an internal voltage and to generate a first division voltage and a second division voltage, wherein a level of the second division voltage is higher than a level of the first division voltage; a pull-up amplification block configured to compare the level of the first division voltage with a level of a bit line precharge voltage on a bit line precharge voltage line, and to raise the level of the bit line precharge voltage; a pull-down amplification block configured to compare the level of the second division voltage with the level of the bit line precharge voltage and to lower the level of the bit line precharge voltage. Here, the pull-down amplification block may lower the level of the bit line precharge voltage to a target level more quickly during a refresh operation than during a non-refresh operation.

In another exemplary aspect, a bit line precharge voltage generation circuit for a semiconductor memory apparatus may comprise: a down comparison signal generation block configured to compare a level of a division voltage with a level of a bit line precharge voltage and to generate a down comparison signal; and a pull-down control block configured to lower the level of the bit line precharge voltage when the down comparison signal is enabled. Here, the division voltage may be generated by dividing an internal voltage. Furthermore, the down comparison signal generation block may reduce an enable transition time of the down comparison signal during a refresh operation more than during a non-refresh operation. Furthermore, the pull-down control block lowers the level of the bit line precharge voltage more quickly during the refresh operation than during the non-refresh operation.

In yet another exemplary aspect, a voltage generation circuit for a semiconductor memory apparatus may comprise: a voltage division block configured to divide an internal voltage and to generate a first division voltage and a second division voltage, wherein a level of the second division voltage is higher than a level of the first division voltage; a pull-up amplification block configured to compare the level of the first division voltage with a level of a bit line precharge voltage on a bit line precharge voltage line and to raise the level of the bit line precharge voltage; and a pull-down amplification block configured to compare the level of the second division voltage with the level of the bit line precharge voltage and to lower the level of the bit line precharge voltage.

In still another exemplary aspect, a method for generating a bit line precharge voltage for a semiconductor memory apparatus may comprise: dividing an internal voltage and generating a first division voltage and a second division voltage, wherein a level of the second division voltage is higher than a level of the first division voltage; comparing the level of the first division voltage with a level of a bit line precharge voltage on a bit line precharge voltage line and raising the level of the bit line precharge voltage; and comparing the level of the second division voltage with the level of the bit line precharge voltage and lowering the level of the bit line precharge voltage. Here, the step of lowering the level of the bit line precharge voltage to a target level may be accomplished more quickly during a refresh operation than during a non-refresh operation.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
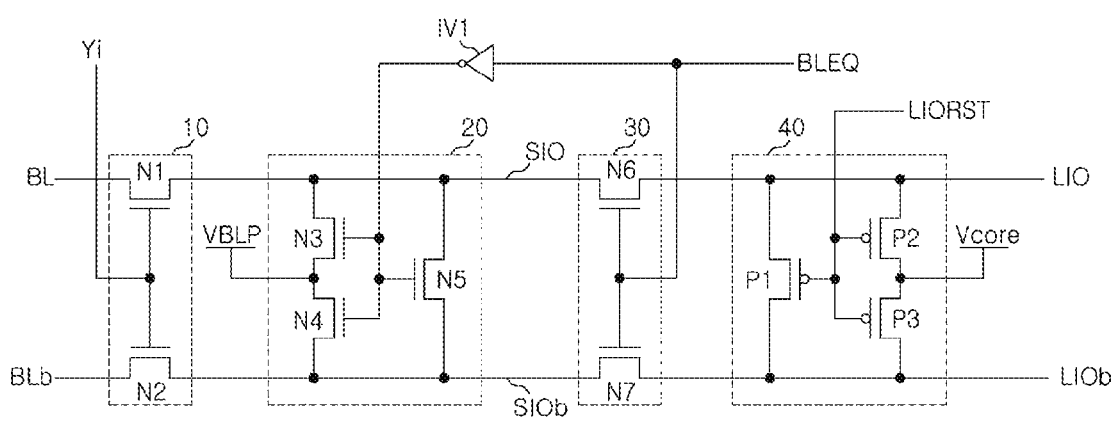
FIG. 1 is a diagram illustrating a configuration of a conventional semiconductor memory apparatus.

Reference will now be made in detail to the exemplary embodiments consistent with the present disclosure, examples of which are illustrated in the accompanying drawings. Wherever possible, the same reference characters will be used throughout the drawings to refer to the same or like parts.

Figure 2:
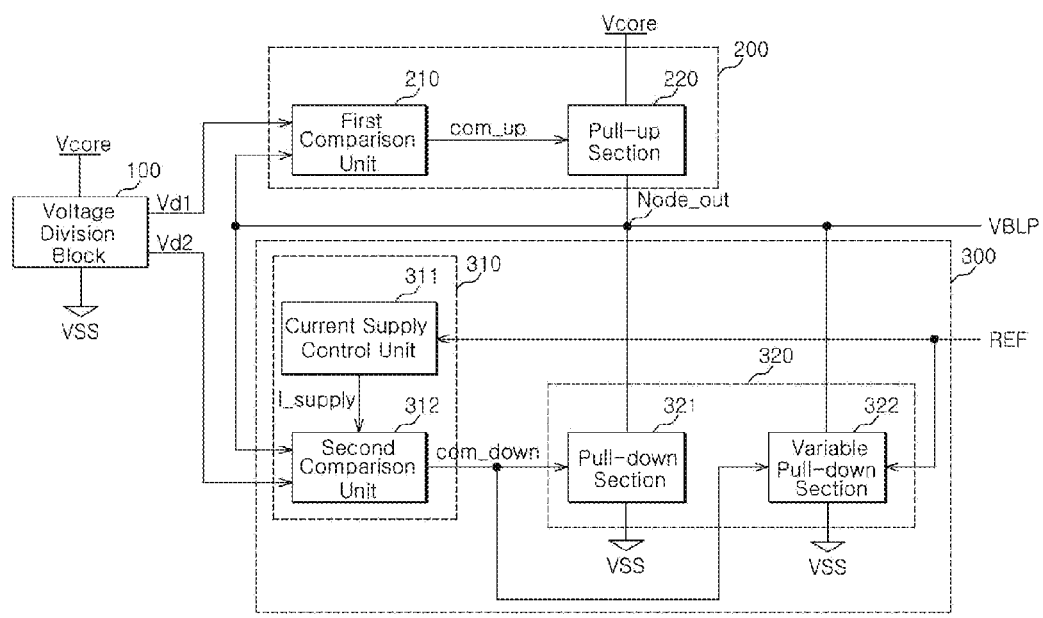
FIG. 2 is a diagram illustrating an exemplary configuration of a bit line precharge voltage generation circuit for a semiconductor memory apparatus according to one embodiment.
Figure 3:
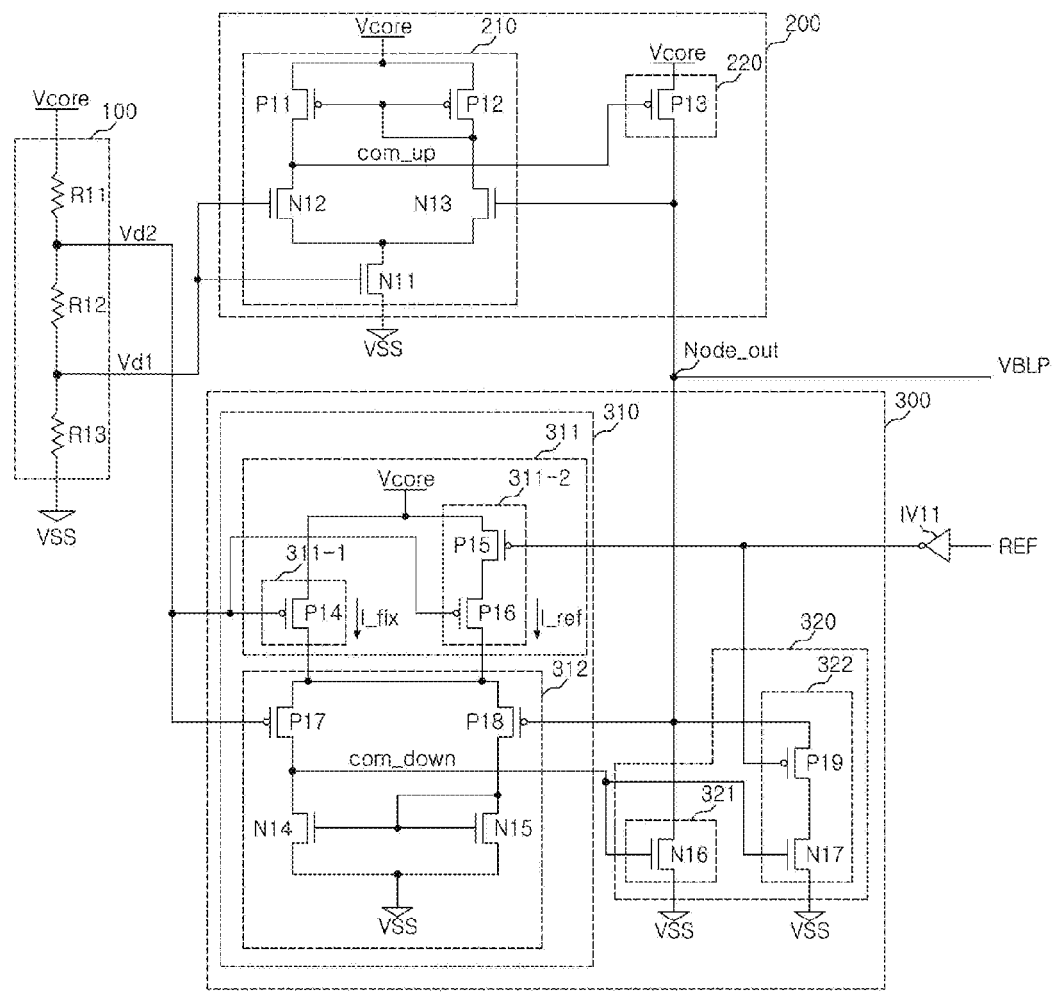
FIG. 3 is a schematic circuit diagram of the bit line precharge voltage generation circuit shown in FIG. 2.

FIGS. 2 and 3 illustrate exemplary configurations of a bit line precharge voltage generation circuit for a semiconductor memory apparatus according to one embodiment. The bit line precharge voltage generation circuit may include a voltage division block 100, a pull-up amplification block 200, and a pull-down amplification block 300.

As illustrated in FIG. 2, the voltage division block 100 may divide an internal voltage (hereinafter, a core voltage 'Vcore') and generate a first division voltage 'Vd1' and a second division voltage is 'Vd2', a level of which is higher than a level of the first division voltage 'Vd1'.

As illustrated in FIG. 3, the voltage division block 100 may include first through third resistors R11 through R13 connected in series. The voltage division block 100 may receive a core voltage 'Vcore' at one terminal, and may connect to a ground terminal 'VSS' at the other terminal. The voltage division block 100 may output the second division voltage 'Vd2' through a node where the first and second resistors R11 and R12 are connected together, and the voltage division block 100 may output the first division voltage 'Vd1' through a node where the second and third resistors R12 and R13 are connected together.

The pull-up amplification block 200 may compare the level of the first division voltage 'Vd1' with the level of the bit line precharge voltage 'VBLP', and may increase the level of the bit line precharge voltage 'VBLP'.

As illustrated in FIG. 2, the pull-up amplification block 200 may include a first comparison unit 210 and a pull-up unit 220. The first comparison unit 210 may compare the level of the first division voltage 'Vd1' with the level of the bit line precharge voltage 'VBLP', and generate an up comparison signal 'com_up'. The pull-up unit 220 may increase the level of the bit line precharge voltage 'VBLP' in response to the up comparison signal 'com_up'. At the same time, the pull-up unit 220 may apply the core voltage 'Vcore' to an output node 'Node_out.' The bit line precharge voltage 'VBLP' may be is outputted through the output node 'Node_out.' The output node 'Node_out' may be connected to a bit line precharge voltage line. The bit line precharge voltage 'VBLP' may be provided to the inside of the semiconductor memory apparatus through the bit line precharge voltage line.

As illustrated in FIG. 3, the comparison unit 210 may include first through fifth transistors N11, N12, N13, P11, and P12. In the first transistor N11, the first division voltage 'Vd1' may be applied to the gate, and the source may be connected to the ground terminal 'VSS'. In the second transistor N12, the first division voltage 'Vd1' may be applied to the gate, and the source may be connected to the drain of the first transistor N11. In the third transistor N13, the bit line precharge voltage 'VBLP' may be applied to the gate, and the source may be connected to the drain of the first transistor N11. In the fourth transistor P11, the core voltage 'Vcore' may be applied to the source, and the drain may be connected to the drain of the second transistor N12. In the fifth transistor P12, the core voltage 'Vcore' may be applied to the source, the gate may be connected to the gate of the fourth transistor P11, and the drain may be connected to the drain of the third transistor N13. At the same time, the up comparison signal 'com_up' may be outputted through a node where the second transistor N12 and the fourth transistor P11 are connected together.

The pull-up unit 220 may include a sixth transistor P13. In the sixth transistor P13, the up comparison signal 'com_up' may be inputted to the gate, the core voltage 'Vcore' may be applied to the source, and the drain may be connected to the output node 'Node_out'.

The pull-down amplification block 300 may compare the level of the second division voltage 'Vd2' with the level of the bit line precharge voltage 'VBLP', and perform an operation of lowering the level of the bit line precharge voltage 'VBLP'. The pull-down amplification block 300 may lower the level of the bit line precharge voltage 'VBLP' to a target level more quickly during the refresh operation than during any other operation, i.e., non-refresh operation.

As illustrated in FIG. 2, the pull-down amplification block 300 may include a down comparison signal generation unit 310 and a pull-down control unit 320.

The down comparison signal generation unit 310 may compare the level of the second division voltage 'Vd2' with the level of the bit line precharge voltage 'VBLP', and generate a down comparison signal 'com_down'. The down comparison signal generation unit 310 may reduce an enable transition time of the down comparison signal 'com_down' much more during the refresh operation than during any other operations.

The pull-down control unit 320 may lower the level of the bit line precharge voltage 'VBLP' when the down comparison signal 'com_down' is enabled. Specifically, the pull-down control unit 320 may lower the level of the bit line precharge voltage 'VBLP' more quickly during the refresh operation than during any other operations.

The down comparison signal generation unit 310 may include a current supply control unit 311 and a second comparison unit 312.

The current supply control unit 311 may supply a larger amount of supply current 'I_supply' to the second comparison unit 312 during the refresh operation than during any other operations.

As illustrated in FIG. 3, the current supply control unit 311 may include a fixed current supply section 311-1 and a refresh current supply section 311-2.

The fixed current supply section 311-1 may supply a fixed current 'I_fix' to the second comparison unit 312, regardless of whether the current is being supplied during the refresh operation or any other operations.

The fixed current supply section 311-1 may include a seventh transistor P14. In the seventh transistor P14, the second division voltage Vd2 is applied to the gate, the core voltage 'Vcore' may be applied to the source, and the fixed current 'I_fix' may be outputted through the drain.

The refresh current supply section 311-2 may supply a refresh current 'I_ref' to the second comparison unit 312 during only the refresh operation.

The refresh current supply section 311-2 may include eighth and ninth transistors P15 and P16. In the eighth transistor P15, an output signal of an inverter IV11 may be inputted to the gate and the core voltage 'Vcore' may be applied to the source. In the ninth transistor P16, the second division voltage 'Vd2' may be applied to the gate, the source may be connected to the drain of the eighth transistor P15, and the refresh current 'I_ref' may be outputted through the drain. At the same time, the supply current 'I_supply' is the sum of the fixed current and the refresh current 'I_ref'. Also, the inverter IV11 may receive a refresh signal 'REF'.

The second comparison unit 312 may receive the supply current 'I_supply', compare the level of the second division voltage 'Vd2' with the level of the bit line precharge voltage 'VBLP', and generate the down comparison signal 'com_down'.

As illustrated in FIG. 3, the second comparison unit 312 may include tenth through thirteenth transistors P17, P18, N14, and N1. In the tenth transistor P17, the second division voltage 'Vd2' may be applied to the gate. In the eleventh transistor P18, the bit line precharge voltage 'VBLP' may be applied to the gate. In the twelfth transistor N14, the drain may be connected to the drain of the tenth transistor P17, and the source may be connected to the ground terminal 'VSS'. In the thirteenth transistor P15, the gate may be connected to the gate of the twelfth transistor N14, the drain may be connected to the drain of the eleventh transistor P18, and the source may be connected to the ground terminal VSS'. At the same time, the down comparison signal 'com_down' may be outputted through a node where the tenth transistor P17 and the twelfth transistor N14 are connected together.

As illustrated in FIG. 3, the pull-down control unit 320 may is include a pull-down section 321 and a variable pull-down section 322.

The pull-down section 321 may lower the level of the bit line precharge voltage 'VBLP' when the down comparison signal 'com_down' is enabled, regardless of whether the refresh operation or any other operation is occurring.

The pull-down section 321 may include a fourteenth transistor N16. In the fourteenth transistor N16, the drain may be connected to the output node 'Node_out', the down comparison signal 'com_down' may be inputted to the gate, and the source may be connected to the ground terminal 'VSS'.

The variable pull-down section 322 may lower the level of the bit line precharge voltage 'VBLP' during only the refresh operation when the down comparison signal 'com_down' is enabled.

The variable pull-down section 322 may include fifteenth and sixteenth transistors P19 and N17. In the fifteenth transistor P19, the output signal of the inverter IV11 is inputted to the gate and the bit line precharge voltage 'VBLP' is applied to the source. In the sixteenth transistor N17, the down comparison signal 'com_down' is inputted to the gate, the drain is connected to the source of the fifteenth transistor P19, and the source is connected to the ground terminal 'VSS'.

Operations of the bit line precharge voltage generation circuit for the semiconductor memory apparatus according to one embodiment will be described below.

When the refresh signal 'REF' is lowered to a low level, only operations other than the refresh operations may occur. A description for non-refresh operations is provided below.

When the level of the bit line precharge voltage 'VBLP' is lower than the level of the first division voltage 'Vd1', the up comparison signal 'com_up' may be lowered to a low level, and the level of the bit line precharge voltage 'VBLP' may increase.

When the level of the bit line precharge voltage 'VBLP' is higher than the level of the second division voltage 'Vd2', the down comparison signal 'com_down' may be enabled to a high level. When the down comparison signal 'com_down' is enabled to a high level and the refresh signal 'REF' is disabled to a low level, the pull-down section 321 may operate to lower the level of the bit line precharge voltage 'VBLP'.

A description for refresh operations is provided below.

When the level of the bit line precharge voltage 'VBLP' is lower than the level of the first division voltage 'Vd1', the up comparison signal 'com_up' may be enabled to a low level, and the level of the bit line precharge voltage 'VBLP' may be increased. That is, the bit line precharge voltage generation circuit for the semiconductor memory apparatus, according to one embodiment, may operate substantially identically during the refresh operation and during any other operation.

When the level of the bit line precharge voltage 'VBLP' is higher than the level of the second division voltage 'Vd2', the down comparison signal 'com_down' may be enabled to a high level. At the same time, the refresh current 'I_ref' and the fixed current 'I_fix' may be supplied to second comparison unit 312 during the refresh operation. Therefore, the time taken for the second comparison unit 312 to transition the down comparison signal 'com_down' to a high level may be shorter during the refresh operation than during any other, i.e., non-refresh, operations.

The variable pull-down section 322 and the pull-down section 321 may operate in response to the down comparison signal 'com_down' during the refresh operation. Consequently, when the level of the bit line precharge voltage 'VBLP' is higher than the level of the second division voltage 'Vd2' during the refresh operation, the pull-down section 321 and the variable pull-down section 322 may operate to lower the level of the bit line precharge voltage 'VBLP'. Thus, the level of the bit line precharge voltage 'VBLP' may be lowered more quickly for the refresh operation than for all operations other than the refresh operation (that is, when only the pull-down section 321 lowers the level of the bit line precharge voltage VBLP).

Consequently, the bit line precharge voltage generation circuit for the semiconductor memory apparatus may further increase the pull-down response speed for the bit line precharge voltage and the pull-down capability during the refresh operation than during any other operation. Therefore, the bit line precharge voltage generation circuit may prevent the level of the bit line precharge voltage 'VBLP' from being raised even when the semiconductor memory apparatus repeats the refresh operation.

Throughout the description, including in the claims, the term "comprising a" should be understood as being synonymous with the term "comprising at least one" unless otherwise specified to the contrary.

While certain embodiments have been described above with reference to illustrative embodiments for particular applications, it should be understood that the embodiments described are by way of example only. Those skilled in the art with access to the teachings provided in this disclosure will recognize additional modifications, applications, and/or embodiments and additional fields in which the present disclosure would be of significant utility. Accordingly, the disclosed bit line precharge voltage generation circuit described herein should not be limited to the described embodiments. Rather, the bit line precharge voltage generation circuit described herein should only be limited in light of the claims that follow when taken in conjunction with the above description and accompanying drawings.

What is claimed is:

1. A bit line precharge voltage generation circuit for a semiconductor memory apparatus, comprising:
    a voltage division block configured to divide an internal voltage and generate a first division voltage and a second division voltage, wherein a level of the second division voltage is higher than a level of the first division voltage;
    a pull-up amplification block configured to compare the level of the first division voltage with a level of a bit line precharge voltage on to a bit line precharge voltage line, and to raise the level of the bit line precharge voltage; and
    a pull-down amplification block configured to compare the level of the second division voltage with the level of the bit line precharge voltage and to lower the level of the bit line precharge voltage, wherein the pull-down amplification block lowers the level of the bit line precharge voltage to a target level more quickly during a refresh operation than during a non-refresh operation.

2. The bit line precharge voltage generation circuit according to claim 1, wherein the pull-down amplification block comprises:
    a comparison unit configured to compare the level of the second division voltage with the level of the bit line precharge voltage and to generate a down comparison signal;
    a current supply control unit configured to supply a larger amount of supply current to the comparison unit during the refresh operation than during the non-refresh operation;
    a pull-down unit configured to lower the level of the bit line precharge voltage in response to the down comparison signal; and
    a variable pull-down unit configured to lower the level of the bit line precharge voltage in response to the down comparison signal during the refresh operation.

3. The bit line precharge voltage generation circuit according to claim 2, wherein the current supply control unit comprises:
    a fixed current supply section configured to supply a fixed current to the comparison unit during the refresh operation and during the non-refresh operation; and
    a refresh current supply section configured to supply a refresh current to the comparison unit during the refresh operation, wherein the supply current comprises the fixed current and the refresh current.

4. The bit line precharge voltage generation circuit according to claim 2, wherein the variable pull-down unit connects the bit line precharge voltage line to a ground terminal in response to a refresh signal and the down comparison signal.

5. The bit line precharge voltage generation circuit according to claim 1, wherein the pull-up amplification block comprises:
    a comparison unit configured to compare the level of the first division voltage with the level of the bit line precharge voltage and to generate an up comparison signal; and
    a pull-up unit configured to apply the internal voltage to the bit line precharge voltage line in response to the up comparison signal.

6. A bit line precharge voltage generation circuit for a semiconductor memory apparatus, comprising:
    a down comparison signal generation block configured to to compare a level of a division voltage with a level of a bit line precharge voltage and to generate a down comparison signal, wherein the division voltage is generated by dividing an internal voltage, and wherein the down comparison signal generation block reduces an enable transition time of the down comparison signal during a refresh operation more than during a non-refresh operation; and
    a pull-down control block configured to lower the level of the bit line precharge voltage when the down comparison signal is enabled, wherein the pull-down control block lowers the level of the bit line precharge voltage more quickly during the refresh operation than during the non-refresh operation.

7. The bit line precharge voltage generation circuit according to claim 6, wherein the down comparison signal generation block comprises:
    a comparison unit configured to compare the level of the division voltage with the level of the bit line precharge voltage and to generate the down comparison signal; and a current supply control unit configured to supply a larger amount of supply current to the comparison unit during the refresh operation than during the non-refresh operation.

8. The bit line precharge voltage generation circuit according to claim 7, wherein the current supply control unit comprises:
a fixed current supply section configured to supply a fixed current to the comparison unit during the refresh operation and during the non-refresh operation; and
a refresh current supply section configured to supply a refresh current to the comparison unit during the refresh operation, wherein the supply current comprises the fixed current and the refresh current.

9. The bit line precharge voltage generation circuit according to claim 6, wherein the pull-down control block comprises:
a pull-down unit configured to lower the level of the bit line precharge voltage when the down comparison signal is enabled during the refresh operation and during the non-refresh operation; and
a variable pull-down unit configured to lower the level of the bit line precharge voltage during the refresh operation when the down comparison signal is enabled.

10. A voltage generation circuit for a semiconductor memory apparatus, comprising:
a voltage division block configured to divide an internal voltage and to generate a first division voltage and a second division voltage, wherein a level of the second division voltage is higher than a level of the first division voltage;
a pull-up amplification block configured to compare the level of to the first division voltage with a level of a bit line precharge voltage on a bit line precharge voltage line and to raise the level of the bit line precharge voltage; and
a pull-down amplification block configured to compare the level of the second division voltage with the level of the bit line precharge voltage and to lower the level of the bit line precharge voltage,
wherein the pull-down amplification block lowers the level of the bit line precharge voltage to a target level more quickly during a refresh operation than during a non-refresh operation.

11. The voltage generation circuit according to claim 10, wherein the pull-down amplification block comprises:
a comparison unit configured to compare the level of the second division voltage with the level of the bit line precharge voltage and to generate a down comparison signal;
a current supply control unit configured to supply a larger amount of supply current to the comparison unit during the refresh operation than during the non-refresh operation;
a pull-down unit configured to lower the level of the bit line precharge voltage in response to the down comparison signal; and
a variable pull-down unit configured to lower the level of the bit line precharge voltage in response to the down comparison signal during the refresh operation.

12. The voltage generation circuit according to claim 11, wherein the current supply control unit comprises:
a fixed current supply section configured to supply a fixed current to the comparison unit; and
a refresh current supply section configured to supply a refresh current to the comparison unit during the refresh operation, wherein the supply current comprises the fixed current and the refresh current.

13. The voltage generation circuit according to claim 11, wherein the variable pull-down unit connects the bit line precharge voltage line to a ground terminal in response to a refresh signal and the down comparison signal.

14. The voltage generation circuit according to claim 10, wherein the pull-up amplification block comprises:
a comparison unit configured to compare the level of the first division voltage with the level of the bit line precharge voltage and to generate an up comparison signal; and
a pull-up unit configured to apply the internal voltage to the bit line precharge voltage line in response to the up comparison signal.

15. A method for generating a bit line precharge voltage for a semiconductor memory apparatus, comprising:
dividing an internal voltage and generating a first division voltage and a second division voltage, wherein a level of the second division voltage is higher than a level of the first division voltage;
comparing the level of the first division voltage with a level of a bit line precharge voltage on a bit line precharge voltage line and raising the level of the bit line precharge voltage; and
comparing the level of the second division voltage with the level of the bit line precharge voltage and lowering the level of the bit line precharge voltage to a target level, wherein the step of lowering the level of the bit line precharge voltage to the target level is accomplished more quickly during a refresh operation than during a non-refresh operation.

16. The method for generating a bit line precharge voltage according to claim 15, wherein the step of comparing the level of the second division voltage with the level of the bit line precharge voltage comprises:
comparing, by a comparison unit, the level of the second division voltage with the level of the bit line precharge voltage to generate a down comparison signal;
supplying a larger amount of supply current to the comparison unit during the refresh operation than during the non-refresh operation; and
lowering the level of the bit line precharge voltage more quickly during the refresh operation than during the non-refresh operation in response to the down comparison signal.

17. The method for generating a bit line precharge voltage according to claim 16, wherein the step of supplying a larger amount of supply current to the comparison unit comprises:
supplying a fixed current to the comparison unit; and
supplying a refresh current to the comparison unit during the refresh operation, wherein the supply current comprises the fixed current and the refresh current.

* * * * *